United States Patent
Blomberg et al.

(10) Patent No.: US 9,468,133 B2
(45) Date of Patent: Oct. 11, 2016

(54) MODULAR COOLING SYSTEM

(71) Applicant: ABB Technology AG, Zürich (CH)

(72) Inventors: Anders Blomberg, Vasterås (SE); Bruno Agostini, Zürich (CH); Jing Ni, Ludvika (SE); Jürgen Hafner, Ludvika (SE); Mathieu Habert, Rheinfelden (CH)

(73) Assignee: ABB Schweiz AG, Baden (CH)

( * ) Notice: Subject to any disclaimer, the term of this patent is extended or adjusted under 35 U.S.C. 154(b) by 78 days.

(21) Appl. No.: 14/627,513

(22) Filed: Feb. 20, 2015

(65) Prior Publication Data

US 2015/0173242 A1 Jun. 18, 2015

Related U.S. Application Data

(63) Continuation of application No. PCT/EP2013/067827, filed on Aug. 28, 2013.

(30) Foreign Application Priority Data

Sep. 3, 2012 (EP) .................................. 12182713

(51) Int. Cl.
*H05K 7/20* (2006.01)
*F28D 15/02* (2006.01)
(Continued)

(52) U.S. Cl.
CPC ....... *H05K 7/20309* (2013.01); *F28D 15/0241* (2013.01); *F28D 15/0266* (2013.01);
(Continued)

(58) Field of Classification Search
CPC ........... F28D 15/0241; F28D 15/0266; F28D 15/0275; H01L 23/427; H01L 23/473; H01L 23/467; H01L 2924/0002; H05K 7/20309; H05K 7/20318; H05K 7/20336; H05K 7/20936; F28F 2270/00

USPC ................................ 361/688–723; 62/259.2
See application file for complete search history.

(56) References Cited

U.S. PATENT DOCUMENTS 4,733,331 A * 3/1988 Chauvet ................ H01L 23/427
165/80.4
4,862,321 A * 8/1989 Saitoo ................... F25B 23/006
257/715

(Continued)

FOREIGN PATENT DOCUMENTS

DE 1 564 694 A1 2/1970
EP 0 310 039 A2 4/1989

(Continued)

OTHER PUBLICATIONS

International Search Report (PCT/ISA/210) mailed on Oct. 11, 2013, by the European Patent Office as the International Searching Authority for International Application No. PCT/EP2013/067827.

(Continued)

*Primary Examiner* — Anthony Haughton
*Assistant Examiner* — Yahya Ahmad
(74) *Attorney, Agent, or Firm* — Taft Stettinius & Hollister LLP

(57) ABSTRACT

An exemplary modular cooling system for cooling a plurality of electronic components is provided. The cooling system includes a plurality of cooling modules and a clamping arrangement. Each cooling module includes an evaporator unit, a condenser, a first pipe system, and a second pipe system. The clamping arrangement is adapted for holding and pressing an alternation stack in which the evaporator units are stacked in alternation with the power electronic components.

20 Claims, 4 Drawing Sheets

(51) Int. Cl.
*H01L 23/427* (2006.01)
*H01L 23/467* (2006.01)
*H01L 23/473* (2006.01)

(52) U.S. Cl.
CPC ......... *F28D15/0275* (2013.01); *H01L 23/427* (2013.01); *H01L 23/473* (2013.01); *H05K 7/20318* (2013.01); *H05K 7/20336* (2013.01); *H05K 7/20936* (2013.01); *F28F 2270/00* (2013.01); *H01L 23/467* (2013.01); *H01L 2924/0002* (2013.01)

(56) References Cited

U.S. PATENT DOCUMENTS

| | | | | |
|---|---|---|---|---|
| 5,925,929 | A * | 7/1999 | Kuwahara | H01L 23/427 165/80.4 |
| 2003/0057546 | A1 * | 3/2003 | Memory | H05K 7/20681 257/706 |
| 2008/0099189 | A1 | 5/2008 | Suh et al. | |
| 2013/0077245 | A1 * | 3/2013 | Gradinger | F28D 1/035 361/700 |
| 2013/0107455 | A1 * | 5/2013 | Cottet | H05K 7/20672 361/694 |
| 2015/0109728 | A1 * | 4/2015 | Campbell | H05K 7/20236 361/679.47 |
| 2015/0173242 | A1 * | 6/2015 | Blomberg | F28D 15/0266 62/259.2 |

FOREIGN PATENT DOCUMENTS

| | | |
|---|---|---|
| EP | 0 582 213 A1 | 2/1994 |
| WO | WO 2011/035943 A2 | 3/2011 |

OTHER PUBLICATIONS

Written Opinion (PCT/ISA/237) mailed on January 21, 2013, by the European Patent Office as the International Searching Authority for International Application No. PCT/EP2013/067827.

International Preliminary Report on Patentability and Written Opinion of the International Searching Authority (Forms PCT/IB373, PCT/IB/326 and PCT/ISA/237) issued on Mar. 3, 2015, by the International Bureau of WIPO, in corresponding International Application No. PCT/EP2013/067827. (6 pages).

* cited by examiner

MODULAR COOLING SYSTEM

RELATED APPLICATION(S)

This application claims priority as a continuation application under 35 U.S.C. §120 to International Application PCT/EP2013/067827 filed on Aug. 28, 2013, designating the U.S., and which claims priority to European Application 12182713.3 filed in Europe on Sep. 3, 2013. The content of each prior application is hereby incorporated by reference.

FIELD

The present disclosure relates to cooling systems for power modules, and in particular to evaporators, such as two-phase coolers for electronic components, and to cooling systems employing such evaporators and to methods for cooling of electronic components such as, for example, power semiconductors.

BACKGROUND

Known power electronic components, for example semiconductor switching elements or the like can be vulnerable to thermal problems due to the amount of thermal energy generated by the current flowing through them. As power electronic devices reach larger and larger power values and consequently dissipate thermal energy, the efficiency of the cooling systems to sustain reliability of such power electronic devices becomes more and more important. Further, the tendency towards achieving higher power densities, such as more compact power electronic devices being able to handle an equal or larger amount of power than before, as well as less space for the cooling system and for the air flow, pose continuous challenges to the design and efficiency of the employed cooling systems.

Moreover, it is desired that cooling systems for modern electrical products have higher performance at a lower price. Performance and price can be positively correlated, which is a constant challenge for design engineers of electrical products.

One option for providing cooling of power electronic devices, for example IGBT (insulated gate bipolar transistor) based components (e.g. press-packs) and/or devices that can be under a voltage with a current flowing through them, is water cooling systems using de-ionized water. However, these systems can be bulky and heavy since they can specify use of a de-ionization unit. Air cooling is another way of providing a simple and inexpensive way of cooling such power electronic devices, but it is limited by the poor thermo-physical properties of air, which has a low thermal conductivity, as well as a low specific heat.

At present, one way of providing an efficient cooling system for power electronic devices is to provide a two-phase cooling circuit. Such a cooling circuit brings a liquid into thermal contact with the heat emitting device. The liquid is heated by the dissipated heat and reaches a boiling temperature. As the temperature of the liquid will not rise above the boiling temperature, the temperature of the liquid and therefore the temperature of the electronic device is kept at a temperature of the boiling point of the liquid as a maximum. The vapour of the liquid is then guided through a conduit—a vapour riser pipe—to a condenser. Within the condenser the vapour is changed into liquid by emitting or releasing heat. For example, in the condenser the heat is emitted to a coolant medium, such as air at ambient temperature. The vapour thus returns to its liquid phase. The condenser and the evaporator unit can be connected via a second line—downcomer pipe—in order to feedback, supported by gravity, the condensed vapour as liquid again to the liquid reservoir of the evaporator unit.

If two-phase cooling circuits are to be used for cooling multiple independent power components their reliability as well as their cooling efficiency should be increased. Further, due to the competitive nature of the market for such cooling circuits, reducing the cost of production is desired.

The U.S. Pat. No. 4,733,331 discloses a heat dissipation mechanism for power semiconductor elements that can be stacked together with associated evaporation blocks to form a column. The evaporation blocks can be fluidly connected, via tubes including electrically insulating connective elements, to first dissipator bodies, or condensors. The latter can be located vertically below second dissipator bodies, in order that the coolest air rising due to natural convection serves first for the cooling of the semiconductor elements via the respective associated first dissipator bodies. A ventilator (e.g., ventilation means) can be arranged to provide forced ventilation along a horizontal stacking direction.

In one aspect, a modular cooling system for cooling a plurality of power electronic components, the cooling system including a plurality of cooling modules and a clamping arrangement is provided. Each of the cooling modules includes, respectively, an evaporator unit adapted for receiving heat from a corresponding one of the power electronic components, the evaporator unit having an inlet for receiving a liquid cooling fluid, an evaporator body for evaporating the cooling fluid by the heat, and an outlet for letting out the vaporized cooling fluid; a condenser having an inlet for receiving the vaporized cooling fluid, a condenser body for condensing the cooling fluid, and an outlet for letting out the condensed liquid cooling fluid; a first pipe system connecting the outlet of the evaporator unit with the inlet of the condenser; and a second pipe system connecting the outlet of the condenser with the inlet of the evaporator unit. Each of the cooling modules forms a respective individual cooling fluid circuit separate from the cooling fluid circuits of the other cooling modules of the cooling system, and the clamping arrangement is adapted for holding and pressing an alternating stack in which the evaporator units can be stacked alternately with the power electronic components in a stacking direction. Further, the condenser of each cooling module includes at least one coolant medium passageway for an external coolant medium, wherein the at least one coolant medium passageway defines a flow direction for the external coolant medium transverse to the stacking direction of the alternating stack.

Electrically insulating portions in the form of solid layers can be used between adjacent, or neighbouring, condensers of separate cooling modules. This arrangement provides an easy to assemble, cost effective and reliable solution for electrically insulating a plurality of cooling modules from each other, and avoids a specifying an arrangement that includes electrically insulating sections on the pipes between the evaporating units and the condensers.

In another aspect, a power electronic unit including the aforementioned modular cooling system and a plurality of the power electronic components is provided. The clamping arrangement holds and presses the alternating stack in which the evaporator units can be stacked in alternation with the power electronic components in the stacking direction.

In yet another aspect, a use of the aforementioned modular cooling system or power electronic unit for cooling the plurality of the power electronic components is provided. The clamping arrangement holds and presses together the alternating stack in which the evaporator units can be stacked in alternation with the power electronic components in the stacking direction.

In yet another aspect, a method of cooling a plurality of power electronic components by a modular cooling system, the cooling system including a plurality of cooling modules and a clamping arrangement is provided. Each of the cooling modules includes, respectively, an evaporator unit having an inlet, an evaporator body and an outlet; a condenser having an inlet, a condenser body, an outlet, and at least one coolant medium passageway; a first pipe system; and a second pipe system. The clamping arrangement holds and presses an alternating stack in which the evaporator units can be stacked alternately with the power electronic components in a stacking direction. The method includes transferring heat from one of the power electronic components to a corresponding one of the evaporator bodies; evaporating a liquid cooling fluid inside of the evaporator body by the heat from the power electronic component; guiding the vaporized cooling fluid via the first pipe system from the evaporator's outlet to the condenser's inlet; condensing the vaporized cooling fluid to a liquid phase by removing heat from the vaporized cooling fluid in the condenser body; and guiding the liquid cooling fluid via the second pipe system from the condenser outlet to the evaporator inlet. The cooling fluid is circulated in a fluid cooling circuit including the evaporator body, the first pipe system, the condenser body and the second pipe system of the respective cooling module, whereby the fluid cooling circuit is an individual fluid cooling circuit separate from the fluid cooling circuits of the other cooling modules, and whereby removing heat from the vaporized cooling fluid in the condenser body includes guiding an external coolant medium in a flow direction transverse to the stacking direction of the alternating stack.

Further aspects, advantages and features of the present disclosure can be apparent from the dependent claims, the description and the accompanying drawings.

SUMMARY

A modular cooling system for cooling a plurality of power electronic components is disclosed, the cooling system comprising: a plurality of cooling modules, wherein each of the cooling modules includes: an evaporator unit adapted for receiving heat from a corresponding one of the power electronic components, the evaporator unit having an inlet for receiving a liquid cooling fluid, an evaporator body for evaporating the cooling fluid by the heat, and an outlet for output of the vaporized cooling fluid; a condenser having an inlet for receiving the vaporized cooling fluid, a condenser body for condensing the cooling fluid, and an outlet for output of the condensed liquid cooling fluid; a first pipe system connecting the outlet of the evaporator unit with the inlet of the condenser; and a second pipe system connecting the outlet of the condenser with the inlet of the evaporator unit, wherein each of the cooling modules forms a respective individual cooling fluid circuit separate from the cooling fluid circuits of the other cooling modules of the cooling system, with adjacent condensers of the cooling modules being electrically insulated from one another, wherein the condenser of each cooling module includes at least one coolant medium passageway for an external coolant medium, wherein the at least one coolant medium passageway defines a flow direction for the external coolant medium transverse to the stacking direction of the alternating stack, and wherein the evaporator units are stacked alternately with the power electronic components in a stacking direction in an alternating stack.

DESCRIPTION OF THE DRAWINGS

A full and enabling disclosure including the best mode thereof is set forth more particularly in the remainder of the specification, including reference to the accompanying figures wherein.

DETAILED DESCRIPTION

Figure 1:
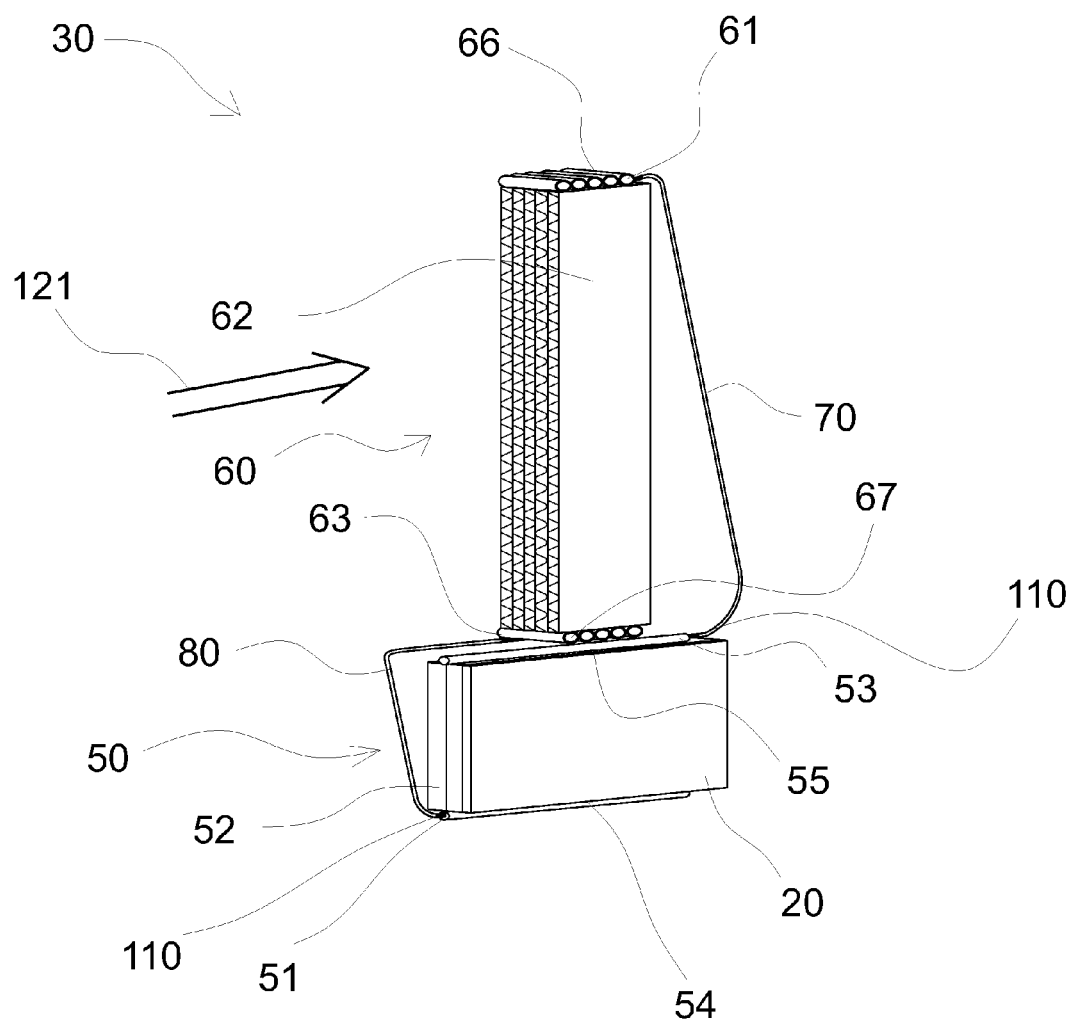
FIG. 1 schematically shows a perspective view of a cooling module according to an exemplary embodiment of the present disclosure.

Reference will now be made in detail to the various embodiments, one or more examples of which can be illustrated in each figure. Each example is provided by way of explanation and is not meant as a limitation. For example, features and/or method steps illustrated or described as part of one embodiment and/or method can be used on or in conjunction with other embodiments and/or method steps to yield yet further embodiments or methods. It is intended that the present disclosure includes such modifications and variations.

Within the following description of the drawings, the same reference numbers refer to the same or to similar components. Only the differences with respect to the individual embodiments can be described. Unless specified otherwise, the description of a part or aspect in one embodiment applies to a corresponding part or aspect in another embodiment as well.

Although specific features of various embodiments of the disclosure can be shown in some drawings and not in others, this is for convenience only. In accordance with the principles of the disclosure, any feature of a drawing can be referenced and/or claimed in combination with any feature of any other drawing.

Exemplary embodiments of the present disclosure provide a reliable and efficient cooling system including at least two brazed or bonded evaporator units, which can be stacked alternately with electronic components to be cooled, such as power semiconductors is desired. Hence, the subject matter described herein pertains to methods and systems that enable the aforementioned provision of removing heat from electronic components more efficiently than it has been removed in the past. In embodiments described herein, an evaporator unit transfers the absorbed thermal energy from the electronic components to a fluid present inside of the evaporator unit, for example fluid present inside a core of the evaporator unit, via a boiling or evaporative process that takes place on the surfaces of the internal core or cores of the evaporator unit.

One of the advantages of the exemplary cooling system of the present disclosure is its modularity. In other words, the cooling system disclosed herein includes a modular construction, which allows individual cooling modules to be added to or removed from the cooling system. Thereby, when the number of electronic components to be cooled increases or decreases the modular cooling system can be adapted accordingly. This arrangement, for example, ensures spatial economy of the cooling system in working environments with a limited amount of available space. Further, due to the easy assembly of the modular cooling system a replacement of the entire cooling system for a new one, especially, in cases where the number of electronic components to be cooled changes or in cases where one of the cooling modules fails can be avoided. Hence, the overall procurement and maintenance costs associated with cooling electronic components by using the modular cooling system disclosed herein can be reduced significantly.

Furthermore, since each of the cooling modules is adapted to form a respective individual cooling fluid circuit separate from the cooling fluid circuits of the other cooling modules, in cases where one of the cooling modules fails, the remaining cooling modules can remain operational. Hence, reliability of the cooling system is increased and the risk of damaging the electronic components due to a failure of the cooling system is significantly reduced. Further, cooling efficiency is also increased since every cooling module can more easily be adjusted to suit the cooling conditions of the electronic components.

According to embodiments described herein (see description of FIG. 2 below), electrically insulating portions in the form of solid layers can be used between adjacent, or neighbouring, condensers of separate cooling modules, This arrangement provides an easy to assemble, cost effective and reliable solution for electrically insulating a plurality of cooling modules from each other. Accordingly, there is no specification for providing electrically insulating sections on the pipes between the evaporating units and the condensers.

As used herein, the term "evaporator unit" is intended to be representative of any device that provides a cooling surface to remove heat from electronic components and that evaporates a cooling fluid therein. For instance, the evaporator unit can also be denoted as a "cooler", "two-phase-cooler" or "cold plate". As used herein, the term "cooling module" is intended to be representative of a closed cooling fluid circuit that can include at least an evaporator unit and a condenser, which can be in fluid communication with each other.

As used herein, the term "condenser" is intended to be representative of any type of heat exchanger such as, for example, a plate fin or phase-change heat exchanger or combinations thereof.

As used herein, the term "condenser-connection arrangement" is intended to be representative of any type of electrically insulating frame or structural unit that provides support to one or more condensers arranged in proximity to each other. The condenser-connection arrangement of exemplary embodiments described herein can provide a compressive force to ensure good support of a plurality of condenser arranged next to each other. In exemplary embodiments described herein, the condenser-connection arrangement can be a frame, adjustable in size, to which the one or more condensers can be mechanically attached.

In the context of the present disclosure, the term "clamping arrangement" is intended to be representative of any mechanical arrangement, which provides a clamping force to an alternating stack of evaporator units that can be stacked alternately with electronic components, thereby, forming a pressed-stack configuration. One example of such a clamping arrangement can be a mounting clamp with two support rods or for long stack configurations the use of a four-rod Belleville spring construction. Further, in the embodiments described herein, the clamping arrangement can, for example, include load spreaders and spacers.

As used herein, the term "transverse" means that two directions can be substantially non-parallel, e.g., can be arranged at an angle above usual tolerances with respect to each other, for instance above 10° with respect to each other. Thus, a flow direction which is transverse to a stacking direction is substantially non-parallel to the stacking direction and for instance forms an angle greater than 10° with respect to the stacking direction.

As used herein, the term "electronic component" or "power electronic component" is intended to be representative of any power electronic component such as high power semi-conductor switching elements or the like.

As used herein, the term "power electronic unit" is intended to be representative of a unit including the modular cooling system described herein, including a plurality of power electronic components and a clamping arrangement, e.g., a power electronic unit can be a power electronic building block. According to an exemplary embodiment, a power electronic unit has a reverse or blocking voltage greater than 500 V.

According to exemplary embodiments described herein, the evaporator unit can include an evaporator body including an inner volume for the cooling fluid. The evaporator body can further include thermo-conducting walls that can be in good thermal contact with the cooling fluid in the inner volume of the evaporator body, such that heat produced by an electronic component abutting the thermo-conducting wall(s) is transferred to the cooling fluid. The thermo-conducting walls (e.g. made of a metal such as aluminium) can be an integral part of the evaporator body, or can be mounted to it during manufacturing, for example, by brazing in accordance with an exemplary embodiment.

The evaporator unit can be made of a metal such as aluminium or copper but it can also be made of other metals or alloys. The inside or core of the evaporator body can be designed to have a considerable surface for exchanging heat from the thermo-conducting walls and the cooling fluid in order to increase the area for heat exchange and to locally decrease the heat flux. Hence, in order to increase the aforesaid effective area of energy exchange between the core and the liquid coolant, the effective area can be enhanced by various measures. The core can, e.g., include any type of fins, such as corrugated fins, louvered fins, wavy fins, staggered fins, offset fins, or straight fins. Further, the core can alternatively or additionally include one of a multiport or multi-channel profile, a metal sheet, a tube, at least two connected tube sections, a honeycomb structure, or an open cell foam.

As far as manufacturing is concerned, in cases in which the evaporator unit includes multiple parts, brazing or soldering may ensure a good mechanical, thermal, and electrical joint amongst the parts. If the core includes fins, the core can also be assembled by adding multiple fin layers on top of each other to increase the core height and the heat exchange area. In between, layers of brazing foil can be inserted to provide a better joint between two consecutive layers. If the fin sheets can be cladded with brazing material, the interposing foil can optionally be omitted. The evaporator unit can also be manufactured by an extrusion process, which ensures an exact and smooth surface finish.

The coolant, which can be delivered to the evaporator unit in liquid form or with low vapour qualities (e.g., with a low content of vapour), takes up thermal energy when getting into contact with the surface of the core. Thereby, the liquid undergoes a phase change and becomes vapour. As is well known, the amount of energy absorbed during this process, the enthalpy of vaporization, is high. As an example, the energy specified to vaporize 1 kg of water (at ambient pressure) having a temperature of little less than 100° C. is approximately the same energy that is specified to heat up the same amount of water from the freezing point to liquid water of slightly below 100° C.

Hence, when the characteristics of the coolant and the operating pressures in the cooling system can be suitably chosen by design, which is a standard task for a skilled person, the evaporator unit can dissipate significant amounts of thermal energy from electronic components by promoting the vaporization of the coolant, e.g., a phase change. Thereby, the temperature change between the liquid coolant before entering the evaporator unit and the vapour leaving the evaporator unit can be insignificant, as the dissipated energy is mainly transferred in the vaporization or phase change process. It is promoted that the vaporized coolant can freely stream out of the evaporator unit in order to minimize a build-up of pressure of already gaseous coolant in the core, which might reduce the effectiveness of the further vaporization process and thus reduce the cooling efficiency.

The evaporator unit of each separate cooling circuit can further include a cooling fluid distribution and collection chamber. The distribution chamber—distributor—can distribute the liquid cooling fluid received from a condenser to the evaporator core whereas the collection chamber—collector—can collect evaporated cooling fluid from the evaporator core and subsequently let out the evaporated cooling fluid to the condenser. The cooling fluid distributor/collector can either be separate parts or integral parts of the evaporator body.

The aforesaid cooling fluid collector can have a separator volume that enables a separation of the liquid and gas phases of the cooling fluid (e.g., at least a partial separation of a predominantly liquid portion from a predominantly vaporous, e.g., gaseous portion). The predominantly gaseous phase can be let out via a first pipe system to a condenser. Similarly, the aforesaid cooling fluid distributor can also have a separator volume, which during operation contains a pool of liquid cooling fluid that is continuously fed to the core of the evaporator unit.

A minimum of one inlet tube and one outlet tube can be provided to feed and remove the liquid/vaporous cooling fluid to and from the evaporator unit. The shape and size of the inlet and outlet can vary depending on the electrical and mechanical specifications of the installation.

The evaporated cooling fluid transfers its thermal energy in the condenser, whereby the density of the cooling fluid significantly increases during the accompanying condensation. This increase in density provides for low pressure on the outlet side of the evaporator unit, promoting the exit of the vaporized cooling fluid from the evaporator unit to the condenser.

The outer dimensions of the body of the evaporator unit, such as its diameter or length and width, can be similar to the ones of the electronic component(s) to be cooled, for example a power semiconductor such as an IGTB. Hence, also the outer dimensions of the core in the evaporator unit can be restricted. The limited space for the process of heat exchange between the core and the coolant is a limiting factor for the effectiveness of the cooling system using an evaporator unit according to embodiments. In order to increase the effective area of energy exchange between the core and the liquid coolant, the effective area can be enhanced by various measures. The core can, e.g., include any type of fins, such as corrugated fins, louvered fins, wavy fins, staggered fins, offset fins, or straight fins. Further, the core can alternatively or additionally include one of a multiport or multi-channel profile, a metal sheet, a tube or fine tubes, at least two connected tube sections, a honeycomb structure, or an open cell foam.

The condenser includes an inlet for receiving an evaporated cooling fluid, a condenser body for condensing the cooling fluid, and an outlet for letting out the condensed liquid cooling fluid. The condenser, according to embodiments described herein, can be in fluid communication with an evaporator unit. Similarly, to the evaporator unit, the condenser can further include a cooling fluid collector/distributor, each of which includes a separator volume. However, with respect to the condenser, the cooling fluid distributor can distribute the evaporated cooling fluid received from the evaporator unit to the condenser body, whereas the cooling fluid collector can collect the condensed cooling fluid within the condenser body to eventually transfer it back to the evaporator body. The aforesaid cooling fluid distributor/collector can be separate or integral parts of the condenser.

According to exemplary embodiments of present disclosure, the condenser can be designed like any known air heat exchanger with an internal volume for accommodating a cooling fluid therein, and at least one in- and outlet for circulating a cooling fluid there through. Further, to have a large heat transfer area, a plate fin-type heat exchanger can be employed in the modular cooling system described herein. This type of heat exchanger can use at least one passageway with fins to increase the cooling efficiency of the unit to guide an external coolant medium there through. There can be various design options for the at least one passageway including straight fins, offset fins and wavy fins (e.g. louvered fins). Fin-type heat exchangers can be made of an aluminium alloy that provides high heat transfer efficiency. These types of materials and alloys reduce the overall weight of the modular cooling system and enable the condenser to withstand high working pressures.

The cooling system described herein provides increased reliability by being configured modularly, e.g., every one of the cooling modules includes a separate cooling fluid circuit. For instance, every evaporator unit includes a respective condenser to which it is connected in a closed fluid circuit. This arrangement ensures that in cases where a cooling module fails the remaining cooling modules stay operational. Moreover, since the electronic component(s) in a stacked configuration, as described in embodiments herein, can be cooled from both sides (these sides of the electronic component(s) being defined as having the greatest surface area available for cooling) and each of these sides is being cooled by a different cooling module, then if one of a plurality of cooling modules fails the other adjacent cooling module arranged in the stacking direction can provide cooling to the specified electronic component. Thereby, damage to the electronic component(s) due to failure of a cooling module can be prevented.

Furthermore, according to exemplary embodiments described herein the plurality of condensers can be arranged removably to a condenser-connection arrangement. Thereby the condensers can be lined up in a common plane in the stacking direction of the stack of electronic components. Embodiments of the condenser-connection arrangement can include a framework or frame-like structure that is electrically insulated and further includes an attach/release mechanism, which enables a rapid and easy addition or removal of separate condenser units.

Difficulties can arise in cooling systems having a plurality of electronic components and a plurality of cooling modules, especially when the cooling modules can be on potential as can be the case in press-pack or stack-pack semiconductor packages. According to exemplary embodiments described herein, insulating sections can be arranged such that the plurality of cooling modules can be electrically separate from each other, thereby ensuring an efficient and reliable functioning of the semiconductor packages. In the modular cooling system disclosed herein, such insulating portions can be provided between each condenser. The insulating portion can be in the shape of a plate made of a dielectric material such as, for example, ceramic, glass or an electrically insulating polymeric material. This type of insulation provides a reliable and cost effective way of electrically separating one cooling module from another, facilitates the assembly process of modular cooling system as disclosed herein, and renders the addition/removal and/or exchange of non-functional condensers easy and safe.

The pipe system used in order to fluidly connect the evaporator unit and condenser of each cooling module can be flexible to facilitate assembly and allow thermal expansion of components made of different materials. Further, such flexible pipe systems allow the insulating section to vary in thickness and provide the system with the freedom of movement to allow the stack length to decrease during compression of the stack of power modules. The flexibility of the pipe system can be achieved by providing at least one flexible portion per pipe. This flexible portion can be interposed anywhere along the length of the pipe or can be positioned at either or both end(s) of the pipe.

The mechanical stability of an evaporator unit under compressive load, which can be applied by pressing the stacked evaporator units and electrical components together for good thermal and electrical contact, is determined by its construction. Thereby, it is good practice to construe the evaporator unit such that the load taken up by the thermo-conducting walls is taken up by the core of the evaporator unit, respectively that the walls can be supported by the core. The properties and geometry of the core thus should be able to withstand the exerted forces. If the walls do not have sufficient support from the inside of the evaporator unit, they might experience a bending deformation, which could lead to inhomogeneous electrical and thermal contact resistance, and thus to an undesirable inhomogeneous heat flux and electrical current. Alternatively, the walls might be designed to have a very high stiffness even without significant internal support, such that the exerted forces can be transferred from the walls to the frame. In this case, the core could not have to be construed as stable as in the case described above.

As an example, in a finned core, by adjusting fin thickness and height, different compressive loads can be sustained without incurring a deformation of the evaporator unit that could—due to the deformation of the evaporator unit including the top and bottom walls—the thermal performance of the system by increasing the thermal resistance at the interface between each electronic component and the evaporator unit. When the electronic component is packaged with the evaporator unit as a module, and the current path does not lead through the evaporator unit, a thermal paste or other means can be used to further reduce the thermal contact resistance. On the other hand, this is not possible in the case of a press-pack or stack-pack configuration, in which hockey-puck type components or stack-pack type components specify the current to flow through the contacting evaporator units. The evaporator units can also be electrically connected to other parts of the electric circuit of the electrical components being cooled. A high mechanical stiffness of the core, and thus of the evaporator unit as a whole, can be achieved by using multiport profiles.

With respect to stacked configurations of high power electrical components with heat sinks such as the evaporator units described herein, in order to utilize their full potential a proper arrangement of the complete assembly including the press-pack high power electrical components, cooling modules, bus bars and other components, is called for. Hence, the mechanical design and assembly of the stack can be decisive for the performance and reliability of the press-pack high power electrical component(s). Inhomogeneous pressure distribution can lead to premature device failure.

For this purpose, a clamping arrangement or fixture can be employed that is capable to withstand without damage temperature levels and forces caused by the mechanical expansion and contraction of the press-pack due to temperature changes that appear at working conditions. The clamping arrangement can, for example, include force indicators, which ensure that the stack of alternating evaporator units and electronic components can be clamped with the right force to ensure favorable performance and homogenous pressure distribution (optionally, for example via a load spreader that can be a stainless steel plate) over the whole contact surface of the electrical component(s). A clamping force that is too low can result in increased impedance and a decrease in the surge current rating, and a too high clamping force can damage the electronic component(s) causing them to fail prematurely.

The air heat exchangers described herein can be configured to provide lateral securement for the removable plate-like insulating material. In alternative embodiments, the insulating material can be an integral part of each individual air heat exchanger. As already described above, the air heat exchangers described herein can provide at least one passageway for the external coolant medium, the external coolant medium being defined as the coolant medium outside the cooling fluid circuit that carries away the heat, which is transferred from the evaporated cooling fluid. The at least one passageway can define the direction of flow of the external coolant medium through the heat exchanger. In plate-fin heat exchangers, for example, the fins can be rearranged. This arrangement allows for adjusting the flow direction of the external coolant medium with respect to the cooling fluid or with respect to the stacking direction of a press-pack stack of power modules and evaporator units.

According to other exemplary embodiments described herein, the modular cooling system can be arranged such that the direction of the electrical current flowing through the stack of electronic components is transverse to the external coolant medium flowing through the condenser(s). The electrical current flowing through the stack of electronic components further can be greater than 45 degrees with respect to the flow direction of the external coolant medium flowing through the condenser(s).

In other words, according to exemplary embodiments of the present disclosure, the at least one coolant medium passageway of the condenser can define a flow direction for the coolant medium that is transverse to the stacking direction of the alternating stack. For instance, this transverse flow direction can be defined as a flow direction for an external coolant medium, which is at an angle greater than 45 degrees with respect to the stacking direction of the alternating stack. In further embodiments herein, the flow direction of the external coolant medium can be perpendicular to the stacking direction with a tolerance level of 10 degrees. The aforementioned arrangements of the modular cooling systems can ensure an efficient cooling of the electronic component(s) and can help to prevent or significantly reduce thermal stacking. The arrangement of the condensers can alternatively or additionally also be described as being stacked along substantially the same direction (up to about 10°) as the stacking direction of the alternating stack.

According to exemplary embodiments described herein, the modular cooling system can further be arranged such that the heat loss or the rate in which heat is lost from the evaporated cooling fluid whilst transferring from the evaporator unit(s) to the respective condenser(s) is minimized. This system prevents a premature condensation of the evaporated cooling fluid before it reaches the condenser. For example, this can be achieved by insulating the first pipe(s), which guide the evaporated cooling fluid from the evaporator unit(s) to the corresponding condenser(s). Alternatively or in addition thereto, a portion of the first pipe(s) can be arranged downstream of the corresponding condenser(s). Thereby, the external coolant medium, which has taken up heat from the condenser(s), provides a heated environment with enough thermal energy to reduce the cooling rate of the evaporated cooling fluid that is guided via the first pipe(s) from the evaporator unit(s) to the corresponding condenser(s).

The modular cooling system described herein can be considered as a gravitational or gravity-driven cooling system, e.g., a cooling system in which the evaporator unit can be in a vertical bottom position and the condenser can be in a vertical top position above the evaporator unit. In this manner, gravity can help to maintain the cooling fluid circulation, because the vaporous cooling fluid is moved vertically upwardly due to its buoyancy, and the liquid cooling fluid returning from the condenser to the evaporator unit is moved vertically downwardly due to its higher mass density.

The evaporator unit could also be mounted in an inclined or even in a horizontal orientation (relative to the earth's surface). Still, in this case the top, bottom etc. can be defined herein by the direction of flow of the evaporated cooling fluid in the evaporator body. For example, when the evaporator unit is mounted in a horizontal orientation relative to the earth's surface, the evaporated cooling liquid in the evaporator unit still moves toward the condenser, e.g., the top if the liquid column provides sufficient pressure. However, in further embodiments herein, the modular cooling system can include a cooling system that is partially or fully driven by a pump, e.g. an electric pump, such that the cooling system can function regardless of the gravitational influence.

According to exemplary embodiments of the present disclosure, each cooling module is easy to manufacture, the cooling system is easy to customize and economical owing to the reduced number of components, their low cost and limited amount of machining that is specified.

FIG. 1 schematically shows a perspective view of a cooling module according to an exemplary embodiment of the present disclosure. The cooling module 30 includes an evaporator unit 50, a first pipe system, and a second pipe system. The first pipe system is referred to hereinafter as vapour riser pipe system 70 for fluidly connecting the evaporator unit 50 to a condenser 60. The second pipe system is referred to hereinafter as liquid downcomer pipe system 80 for fluidly connecting condenser 60 to evaporator unit 50. More precisely, the vapour riser pipe system 70 connects an outlet 53 of the evaporator body 52 with an inlet 61 of the condenser body 62, and the liquid downcomer pipe system 80 connects an outlet 63 of the condenser body 62 with an inlet 51 of the evaporator body 52. This arrangement of cooling module 30 creates a closed fluid circuit wherein a cooling fluid can circulate without being directly exposed to the external environment.

During operation, the cooling module 30 operates as a two-phase thermosyphon in the following manner: The evaporator unit 50 absorbs heat from a heat emitting device such as a power electronic component 20 attached thereto. The heat produces a (partial) phase change of the cooling fluid, from a liquid phase to a gaseous phase, within the evaporator unit 50. The cooling fluid can be any known refrigerant or any other fluid (e.g. a non-polar fluid). The resulting vapour (e.g., the cooling fluid in the gaseous phase) is then let out from the evaporator unit 50, via the outlet 53 of the evaporator body 52, the vapour riser pipe system 70, and the inlet 61 of the condenser body 62, to the condenser 60. In the condenser 60, for example in condenser body 62, the cooling fluid vapour condenses into the liquid phase again, thereby emitting the associated condensation heat to an external coolant medium (not shown in the Figs.), which flows in direction 121 through condenser body 62 and optionally around condenser 60. Subsequently, the liquid cooling fluid is transported back via the outlet 63 of the condenser body 62 and the liquid downcomer pipe system 80 to the evaporator unit 50, into which it enters via the inlet 51 of the evaporator body 52. Consequentially, the cooling module 30 can be described as a two-phase cooling system.

The evaporator unit 50 and condenser 60 can include further features to facilitate a cooling fluid collection and distribution in the cooling circuit of cooling module 30. For example, the evaporator unit 50 can include a cooling fluid distributor 54 interposed between inlet 51 of the evaporator unit 50 and the evaporator body 52. Fluid distributor 54 can have an interior volume for accommodating and distributing the cooling fluid therein. Further, a cooling fluid collector 55 can be interposed between the evaporator body 52 and the outlet 53 of the evaporator unit 50. Fluid collector 55 can have an interior volume for accommodating and collecting evaporated cooling fluid therein. Cooling fluid distributor 66, interposed between inlet 61 of the condenser 60 and the condenser body 62, and cooling fluid collector 67 interposed between evaporator body 52 and the outlet 63 of the condenser 60 have internal volumes for accommodating the cooling fluid in its vapor and liquid phases respectively and can be similar in function to the cooling fluid distributor/collector of evaporator unit 50. The distributors/collectors described herein can be integral parts of the respective evaporator unit 50 and condenser 60 or alternatively can be fabricated separately and attached to the evaporator unit 50 and condenser 60 respectively (e.g., by welding).

In the exemplary embodiment shown in FIG. 1, condenser 60 of cooling module 30 can include a plurality of cooling fluid distributors 66 fluidly connected to one another so as to retain a closed loop cooling circuit for each cooling module 30. Condenser 60 can further include a plurality of cooling fluid collectors 67 also interconnected with one another. According to another exemplary embodiment of the present disclosure, evaporator unit 50 can also include a plurality of cooling fluid collectors/distributors (not shown in the Figs.). Adjusting the number of cooling fluid distributors/collectors and/or the size and shape of their respective internal volumes can facilitate a more homogenous distribution of the liquid/vapour cooling fluid within the respective evaporator unit/condenser and thus can enable a more efficient cooling of electronic components.

As shown in FIG. 1, condenser 60 is in an upright position and designed to have a rectangular shape with its longer sides positioned in a vertical direction with respect to the earth's surface. However, in other exemplary embodiments disclosed herein, the condenser can also be designed in a square shape or can be arranged such that the longer side of the rectangular shaped condenser is positioned horizontal/parallel to the earth's surface. According to yet another exemplary embodiment of the present disclosure, the shape and orientation of evaporator unit 50 can change with respect to the earth's surface.

According to an exemplary embodiment described herein, the vapour riser 70 and liquid downcomer 80 pipe systems of cooling module 30 can each include at least one flexible portion 110, which allows a relative movement between the evaporator unit 50 and condenser 60. For instance, these flexible portions allow a relative movement between a plurality of evaporator units 50 and corresponding condensers 60 when the length of an alternating stack, including evaporator units stacked in alternation with electronic components, is changed in a stacking direction (see FIG. 2 and the description below).

The at least one flexible portion 110 can be disposed anywhere along the length of the vapour riser 70 and liquid downcomer 80 pipe systems. Hence, the aforementioned pipe systems can each be segmented into multiple pipe segments connected via at least one flexible portion. Further, the flexible portion(s) 110 can be an integral part of each of the aforementioned pipe systems or can be an integral part of the condenser 60 and evaporator unit 50 respectively. According to another exemplary embodiment of the present disclosure, the flexible portions 110 can include an insulating material. Thereby, condenser 60 can be electrically insulated from the corresponding evaporator unit 50.

Figure 2:
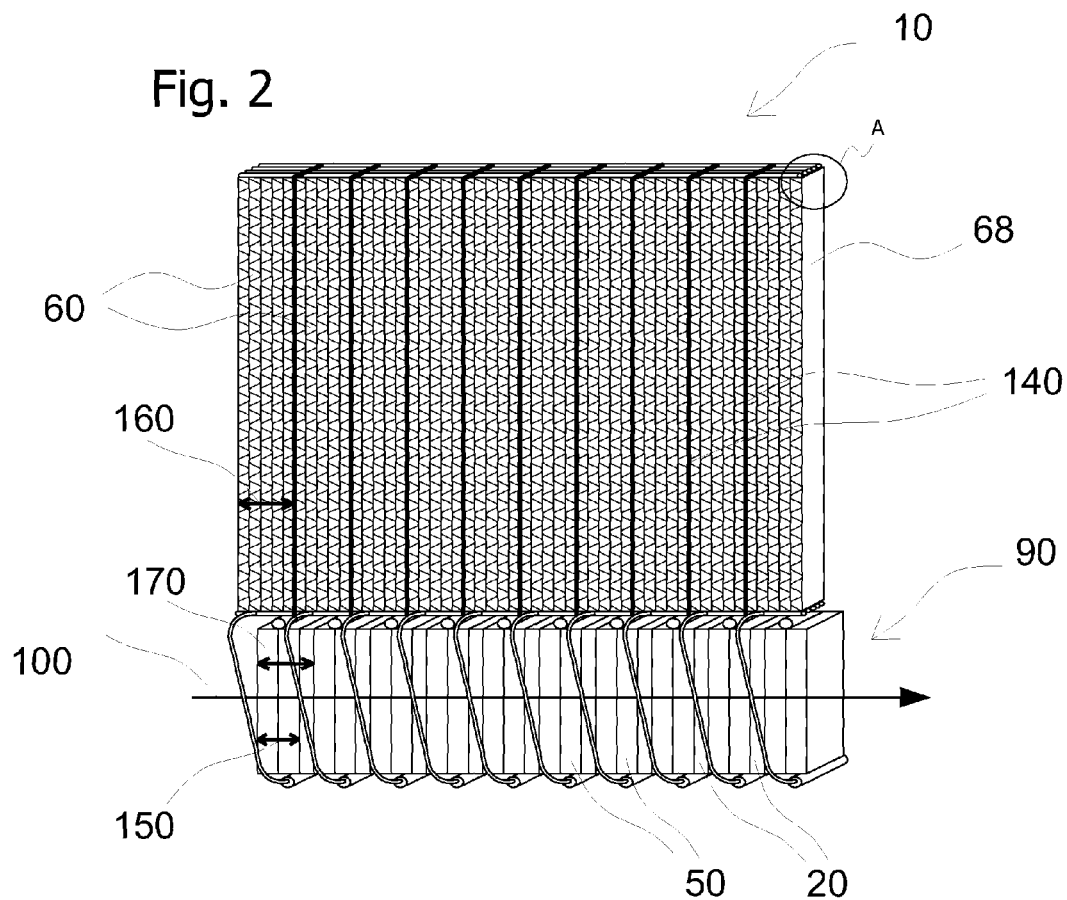
FIG. 2 schematically shows a perspective view of a modular cooling system according to an exemplary embodiment of the present disclosure.

FIG. 2 schematically shows a perspective view of a modular cooling system according to an exemplary embodiment of the present disclosure. As shown in FIG. 2, a plurality of evaporator units 50 are alternately stacked with power electronic components 20 to form stack 90. According to an exemplary embodiment of the present disclosure, since each electronic component can be at a different potential (e.g., voltage), the plurality of electronic components can behave as a potential (e.g., voltage) divider. In an example of a potential divider with N electronic components (IGBT modules), the total potential U can be divided such that the potential difference between neighbouring electronic components is $\Delta = U/N$.

The width 150 of an evaporator unit 50 measured in the stacking direction 100 is less than the width 160 of the corresponding condenser 60. According to an exemplary embodiment, the width 150 is possibly even less than the width 160 of the corresponding condenser 60 to which the corresponding electrically insulating portion 140 is attached, as measured in a direction parallel to the stacking direction 100. According to yet another exemplary embodiment of the present disclosure, the combined width 170 of the evaporator unit 50 and the power electronic component 20 equals the width 160 of the corresponding condenser 60 (optionally with at least one electrically insulating portion 140 attached thereto). Such a dimensional relationship between the evaporator units with electronic components and corresponding condenser with electrically insulating portion facilitates expanding the cooling system by adding additional cooling modules that can all be manufactured in a streamlined process. In other words, the first and second pipe systems of every cooling module can have the same length, which allows an easy extension of the cooling system. For example, if the power electronic components produce too much heat or more power electronic components are desired, additional cooling modules can easily be manufactured and added to the modular cooling system (e.g. in the case of five times more heat, five more cooling modules can be added to the modular cooling system). Also, if more power semiconductor modules can be added, cooling modules of the same shape can be added to the modular system.

A clamping arrangement (e.g. see FIG. 4 and the description below) provides a compressive force to the alternating stack 90 to ensure efficient thermal cooling of the power electronic components 20 by the evaporator unit 50 of the modular cooling system 10. The clamping arrangement can be adapted for the stack 90 and provide a compressive force such that the aforesaid combined width 170 of evaporator unit 50 and the power electronic component 20 equals the displacement 160 of the corresponding condenser 60 with respect to its neighbouring condenser (e.g., the distance between a location of the corresponding condenser with respect to the same location on its neighbouring condenser). In the case of an electrically insulating portion 140 being present between two condensers, this displacement 160 can correspond to the combined width 170 of the corresponding condenser 60 and the electrically insulating portion 140 attached thereto.

According to an exemplary embodiment of the present disclosure, the lateral sides 68 of each condenser 60, which can be perpendicular to the earth's surface, can include a fastening mechanism such as, for example, a quick release fastener for connecting a removable electrically insulating portion 140 to at least one of the lateral sides 68 of condenser 60 (see FIG. 2). Thereby, separate cooling modules with their respective evaporator units and condensers can easily be electrically insulated from each other. Such an arrangement of the insulation could further not affect the reliability of the evaporator unit and facilitate the assembly process of the modular cooling system described herein.

The insulating material can cover only parts or the entire surface area of the lateral side of a condenser, which can reduce material costs. Further, the insulating or dielectric material can extend to cover the lateral side(s) of the coolant fluid distributor 66 and/or coolant fluid collector 67 of the condenser 60 respectively (e.g., the side of the fluid collector/distributor that is parallel to the lateral side of the condenser). This arrangement of the dielectric material ensures that in a modular cooling system 10, which employs a plurality of cooling modules 30, the abutting or adjacently arranged condensers 60 of the plurality of cooling modules 30 can be electrically insulated from each other. This arrangement is beneficial since it ensures a cost effective electrical insulation between separate condensers with a rapid and easy assembly process, especially, in the case when the flexible portions 110 of the vapour riser 70 and/or liquid downcomer 80 pipe systems are not electrically insulating.

According to another exemplary embodiment of the present disclosure, the lateral sides 68 of condenser 60 and/or of coolant fluid distributor 66 and/or collector 67 can include a dielectric material. This arrangement can reduce the space limitations of the modular cooling system since in such a case no insulating portions could be specified to electrically insulate the respective condensers from each other. This arrangement could allow for a more compact design of the modular cooling system and, hence, enable its application in working environments with very limited amounts of available space.

Figure 3:
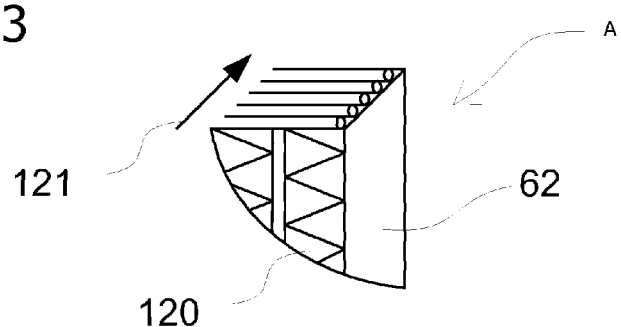
FIG. 3 schematically shows a perspective view of detail A illustrated in FIG. 2 according to an exemplary embodiment of the present disclosure.

According to exemplary embodiments disclosed herein, the condenser body 62 of the condenser 60 includes at least one passageway 120 for an external coolant medium to pass through condenser 60 (see FIG. 3). The at least one passageway 120 defines the flow direction 121 of the external coolant medium. According to other exemplary embodiments of the present disclosure, the at least one passageway 120 defines a flow direction 121 for the coolant medium that is transverse to the stacking direction 100 of the alternating stack 90. This design option prevents thermal stacking and ensures a favourable cooling efficiency of each cooling module 30.

The at least one passageway 120 can include a plurality of fins. A fin-type design can increase the effective surface area for cooling the condenser, which enables a more efficient energy exchange between the cooling fluid inside of the condenser and the external coolant medium.

Figure 4:
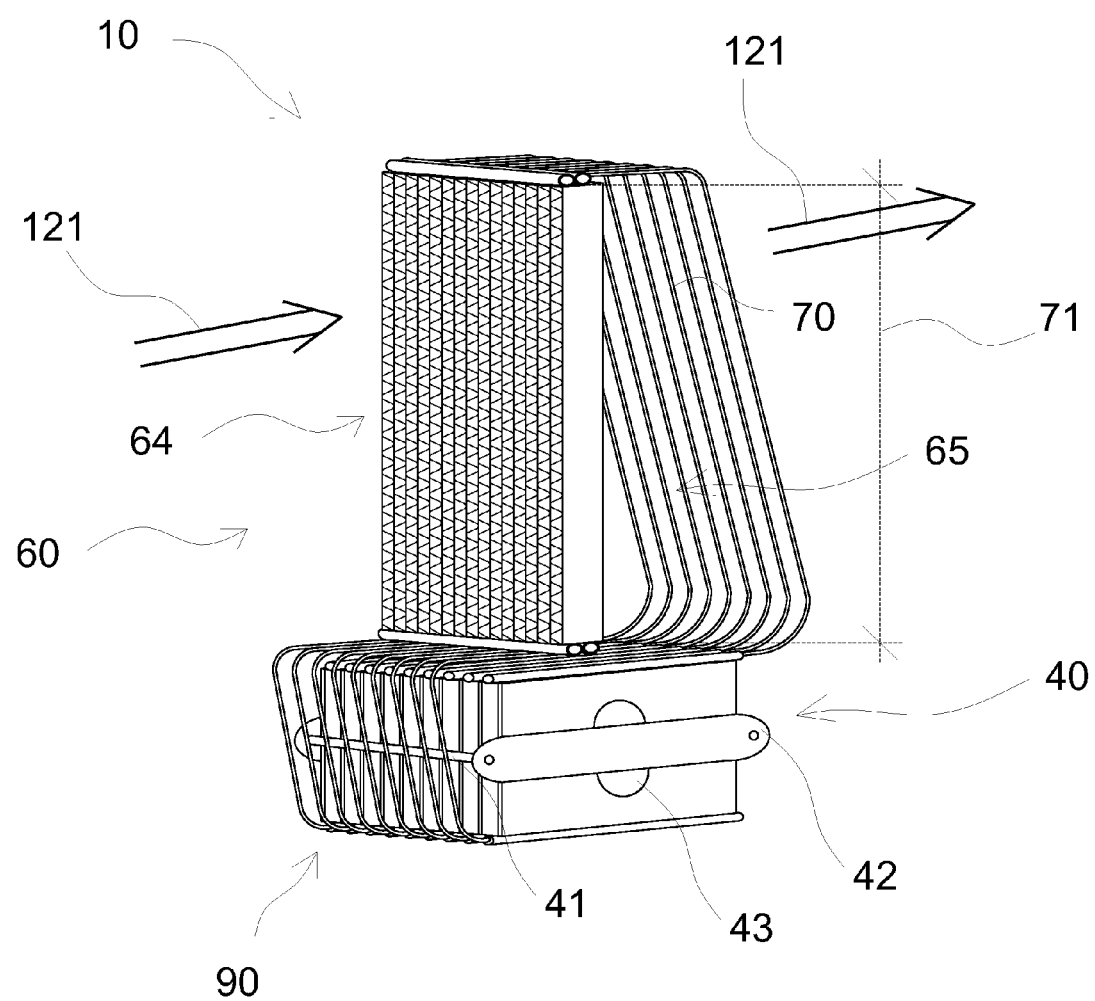
FIG. 4 schematically shows a perspective view of a modular cooling system including a clamping arrangement according to an exemplary embodiment of the present disclosure.

FIG. 4 schematically shows a perspective view of a modular cooling system including a clamping arrangement according to an exemplary embodiment of the present disclosure. As shown in FIG. 4, the modular cooling system 10 includes clamping arrangement 40, which provides a clamping force to the alternating stack 90 in which evaporator units 50 can be alternately stacked with electronic components 20. In embodiments herein, clamping arrangement 40 can includes two parallel support rods 41. However, longer stacks can employ more than two support rods, for example four support rods, in order to ensure an favourable rod mechanical stability that provides a homogenous clamping force distribution (e.g., pressure force distribution) on the electronic components. The clamping arrangement can ensure efficient cooling of evaporator units, thus providing a more reliable and longer life span of electronic components.

In the exemplary embodiment, the mounting clamps 42, for example leaf springs and support rods 41 of clamping arrangement 40 can include an insulating material such as glass-fibre epoxy, which enables a simplified and more compact design of the stack compared to cases where traditional materials such as steel can be used that can specify further insulation of the aforementioned parts and/or enough air strike distance from live parts. Further, clamping arrangement 40 can include a load spreader 43 for homogenous pressure transfer to the evaporator units of the stack. Load spreader 43 can be a steel plate or a plate made of a dielectric material.

The at least one passageway 120 (see FIG. 3) of condenser 60 includes an external coolant medium-intake side 64, towards which the external coolant medium flows to enter into the at least one passageway 120, and an external coolant medium-exit side 65, wherefrom the external coolant medium exits the at least one passageway 120 of condenser 60 (see FIG. 4). In the embodiments described herein, the external coolant medium-intake side 64 of a plurality of condensers (60) can be arranged in a row along the same plane. Similarly, the external coolant medium-exit sides 65 of a plurality of condensers can also be arranged in a row along the same plane.

According to an exemplary embodiment of the present disclosure, for each cooling module 30, a portion of the vapour riser pipe system 70 can be disposed to pass along the coolant medium-exit side 65 or downstream of the corresponding condenser 60. This arrangement ensures that during operation of cooling module 30, after leaving the evaporator unit 50, the evaporated cooling fluid inside of the vapour riser pipe system 70 does not condense into a liquid before having reached the corresponding condenser 60. Hence, the heat transferred from condenser 60 to the external coolant medium, which passes through the condenser 60 via the at least one passageway 121, can prevent or slow down the cooling rate of the cooling fluid vapour in the vapour riser pipe system 70 of the cooling module 30. Thereby, an efficient and uniform cooling of power electronic component 20 can be ensured.

According to yet another exemplary embodiment of the present disclosure, the distance between the vapour riser pipe system 70 and the condenser 60 can be adjusted to ensure favourable fluid dynamics of the evaporated cooling fluid inside of vapour riser pipe system 70 and of the external coolant medium when leaving the coolant medium exit-side of condenser 60. Further, adjusting the distance between condenser 60 and vapour riser pipe system 70 can, for example, be determined in relation to the desired cooling rate of the evaporated cooling fluid inside of vapour riser pipe system 70.

Further, in the embodiment depicted in FIG. 4, the vapour riser pipe system 70 can be disposed to pass along the coolant medium-exit side 65 of condenser 60 such that the distance between the condenser 60 and a portion 71 of the vapour riser pipe system 70 is continuously decreasing in the vertical direction of condenser 60 with respect to the earth's surface.

Figure 5:
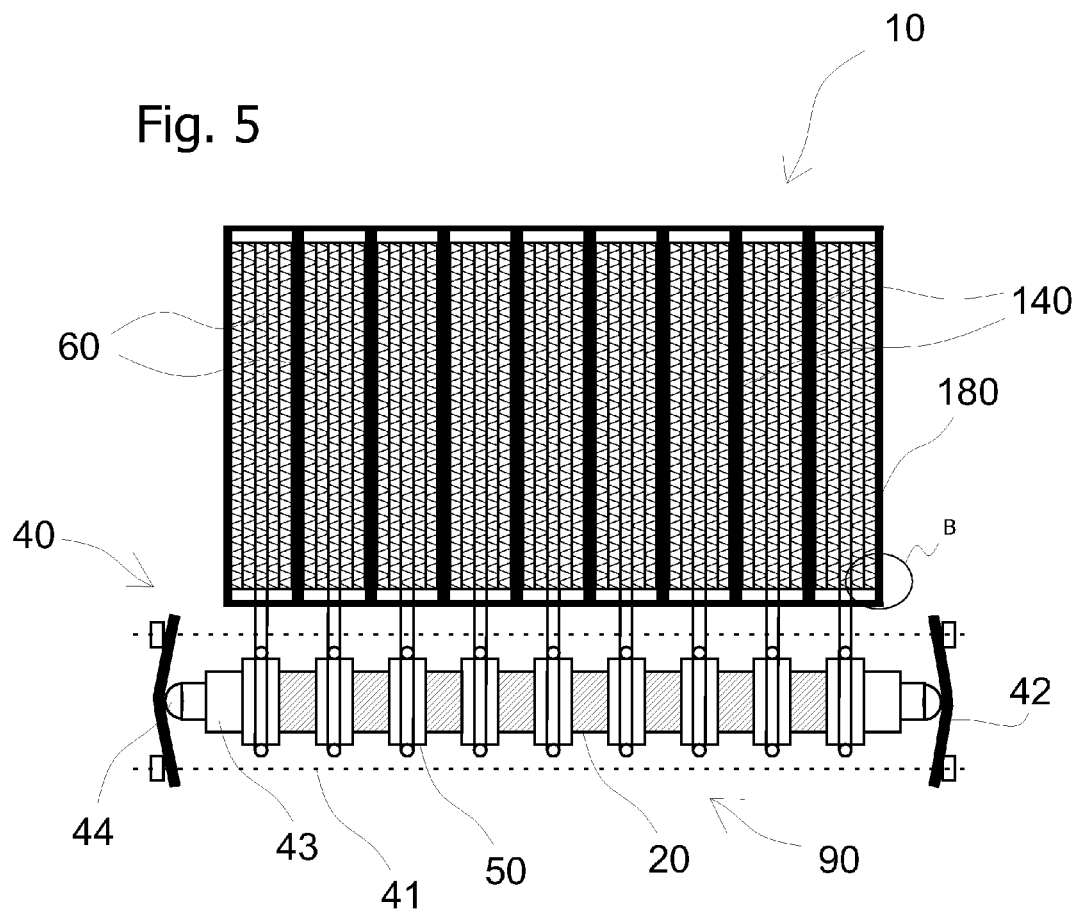
FIG. 5 schematically shows a frontal view of a modular cooling system including a support structure according to an exemplary embodiment of the present disclosure.

FIG. 5 schematically shows a frontal view of a modular cooling system including a support structure according to an exemplary embodiment of the present disclosure. As shown in FIG. 5, the condenser-connection arrangement 180 connects adjacent or abutting condensers 60 to one another. An insulating portion such as a plate 140 made of insulating material is interposed between each pair of abutting condensers 60. Adjacent condensers 60 can be connected to the condenser-connection arrangement 180, lined up in the stacking direction 100 and arranged in a common plane. The condenser-connection arrangement 180 can be designed as a frame, which is adjustable in size such that it can adapt or fit to the number of cooling modules or condensers 60 of the modular cooling system 10. Further, the condenser-connection arrangement 180 can be made of an electrically insulating material.

Further, FIG. 5 shows a frontal view of clamping arrangement 40, which can provide a compressive force to stack 90. Clamping arrangement can include at least two support rods 4, leaf springs 42, and a load spreader 43. Further features can, for example, include a support stand for stack 90 that provides additional stability and a cup shaped load transferor 44 which ensures favourable load absorption from leaf spring 42 and load transfer to load spreader 43.

Figure 6:
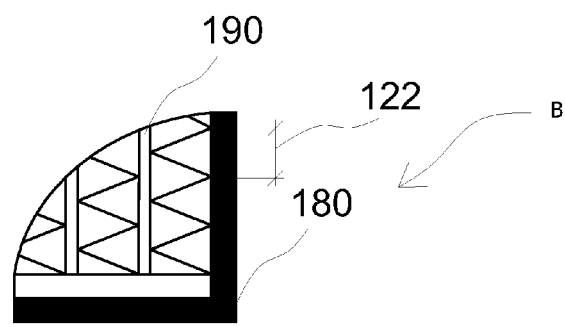
FIG. 6 schematically shows a frontal view of detail B illustrated in FIG. 5 according to an exemplary embodiment of the present disclosure.

FIG. 6 schematically shows a frontal view of detail B illustrated in FIG. 5 according to an exemplary embodiment of the present disclosure. As shown in FIG. 6, the louvered fins of condenser 60 are shown in more detail in which the plurality of fins of each condenser 60 can be arranged such that the distance 122 between consecutive fin tips is from 6 mm to 10 mm, and 8 mm, for example, in accordance with an exemplary embodiment. The condenser 60 of each cooling module includes a plurality of cooling fluid channels 190, with a volume to accommodate therein the cooling fluid. During operation of the modular cooling system 10, the cooling fluid flows through the cooling fluid channels 190 of the condenser under the influence of gravity and due to local pressure differentials induced by the heat from the electronic components 20. The cooling fluid transfers the thermal energy produced by the electronic components 20 via the plurality of cooling fluid channels 190 to the external coolant medium.

According to other exemplary embodiments described herein, a method of cooling a plurality of electronic components by a modular cooling system is provided. A modular cooling system including a plurality of cooling modules and a clamping arrangement is provided. Each of the cooling modules can include an evaporator unit having an inlet, an evaporator body and an outlet; a condenser having an inlet, a condenser body and an outlet; a vapour riser pipe system; and a liquid downcomer pipe system. The clamping arrangement holds and presses an alternating stack in which the evaporator units can be alternately stacked with the electronic components in a stacking direction. The method includes the following steps: Transferring heat from one of the electronic components to a corresponding one of the evaporator bodies; evaporating a liquid cooling fluid inside of the evaporator body by the heat from the electronic component; guiding the evaporated cooling fluid via the vapour riser pipe system from the evaporator's outlet to the condenser's inlet; condensing the evaporated cooling fluid to a liquid phase by removing heat from the evaporated cooling fluid in the condenser body; and guiding the liquid fluid via the liquid downcomer pipe system from the condenser outlet to the evaporator inlet. The cooling fluid is circulated in a fluid cooling circuit including the evaporator body, the vapour riser pipe system, the condenser body and the liquid downcomer pipe system of the respective cooling module. This arrangement ensures that each fluid cooling circuit is an individual fluid cooling circuit separate from the fluid cooling circuits of the other cooling modules. Moreover, removing the heat from the evaporated cooling fluid in the condenser body can include guiding the external coolant medium in a flow direction which is transverse to the stacking direction of the alternating stack (the stack of electronic components and evaporator units arranged in alternation with respect to each other).

For example, the first and second pipe systems have been described as a liquid riser pipe and vapour downcomer pipe. While aspects of the disclosure provide that the condenser body is placed above the evaporator unit and connected via a riser pipe and vapour downcomer pipe for allowing gravitation-driven cooling fluid circulation, alternatively the first and/or second pipe systems can also be arranged in any other manner. If necessary, the cooling fluid circulation can then be effected through a pump or the like.

The above-described systems and methods enable and favour the use of a modular cooling system for cooling electronic components. More specifically, by providing individual fluid cooling circuits separate from the fluid cooling circuits of the other cooling modules, the cooling system can remain operational even if one fluid cooling circuit fails. Thereby, system durability is enhanced and the life time of the electronic components prolonged.

Exemplary embodiments of systems and methods for cooling a plurality of electronic components by a modular cooling system, which includes separate fluid cooling circuits and insulation, can be described above in detail. The systems and methods are not limited to the specific embodiments described herein, but rather, components of the systems and/or steps of the methods can be utilized independently and separately from other components and/or steps described herein.

This present disclosure uses examples to describe the best mode, and also to enable any person skilled in the art to practice the disclosure, including making and using any devices or systems and performing any incorporated methods. While various specific embodiments have been disclosed in the foregoing, those skilled in the art will recognize that the spirit and scope of the claims allows for equally effective modifications. Especially, mutually non-exclusive features of the embodiments described above can be combined with each other. The patentable scope of the disclosure is defined by the claims, and can include other examples that occur to those skilled in the art. Such other examples can be intended to be within the scope of the claims if they have structural elements that do not differ from the literal language of the claims, or if they include equivalent structural elements with insubstantial differences from the literal language of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE NUMBERS modular cooling system 10
power electronic component 20
cooling modules 30
clamping arrangement 40
support rod 41
mounting clamp 42
load spreader 43
load transferor 44
evaporator unit 50
evaporator unit inlet 51
evaporator body 52
evaporator unit outlet 53
cooling fluid distributor 54
cooling fluid collector 55
condenser 60
condenser inlet 61
condenser body 62
condenser outlet 63
coolant medium-intake side 64
coolant medium-exit side 65
cooling fluid distributor 66
cooling fluid collector 67
lateral side of the condenser 68
vapour riser pipe system 70
portion of vapour riser pipe system 71
liquid downcomer pipe system 80
alternating stack 90
stacking direction 100
flexible portion 110
external coolant medium passageway 120
external coolant medium flow direction 121
distance between consecutive fin tips 122
electrically insulating portion 140
width of evaporator unit 150
width of condenser & electrically insulating portion 160 width of evaporator unit & electronic component 170
condenser-connection arrangement 180
cooling fluid channels 190

What is claimed is:

1. A modular cooling system for cooling a plurality of power electronic components, the cooling system comprising:
    a plurality of cooling modules, wherein each of the cooling modules includes:
        an evaporator unit adapted for receiving heat from a corresponding one of the power electronic components, the evaporator unit having an inlet for receiving a liquid cooling fluid, an evaporator body for evaporating the cooling fluid by the heat, and an outlet for output of the vaporized cooling fluid;
        a condenser having an inlet for receiving the vaporized cooling fluid, a condenser body for condensing the cooling fluid, and an outlet for output of the condensed liquid cooling fluid;
        a first pipe system connecting the outlet of the evaporator unit with the inlet of the condenser; and
        a second pipe system connecting the outlet of the condenser with the inlet of the evaporator unit,
    wherein each of the cooling modules forms a respective individual cooling fluid circuit separate from the cooling fluid circuits of the other cooling modules of the cooling system, with adjacent condensers of the cooling modules being electrically insulated from one another,
    wherein the condenser of each cooling module includes at least one coolant medium passageway for an external coolant medium, wherein the at least one coolant medium passageway defines a flow direction for the external coolant medium transverse to the stacking direction of the alternating stack, and
    wherein the evaporator units are stacked alternately with the power electronic components in a stacking direction in an alternating stack.

2. The modular cooling system according to claim 1, comprising:
    ventilation means for forcing the external coolant medium along the flow direction.

3. The modular cooling system according to claim 1, wherein the flow direction for the external coolant medium is perpendicular to the stacking direction of the alternating stack.

4. The modular cooling system according to claim 1, wherein the first and second pipe system of each cooling module includes flexible portions that allow a relative movement between the evaporator units and the corresponding condensers in the stacking direction.

5. The modular cooling system according to claim 1, wherein the condenser of each cooling module has a coolant medium-intake side and a coolant medium-exit side, and wherein a portion of the first pipe system of each cooling module is disposed to pass along the coolant medium-exit side of the corresponding condenser.

6. The modular cooling system according to claim 1, comprising:
    a condenser-connection arrangement for mechanically connecting the condensers to one another such that the condensers are lined up in the stacking direction and arranged in a common plane.

7. The modular cooling system according to claim 1, wherein the condenser-connection arrangement includes an electrically insulated frame structure configured for attaching the condensers removably thereto.

8. The modular cooling system according to claim 1, wherein a length, in the stacking direction, of the electrically insulated frame structure is adjustable to fit a preselected number of cooling modules.

9. The modular cooling system according to claim 1, wherein a width of the evaporator unit as measured in the stacking direction is less than a width of the corresponding condenser as measured in a direction parallel to the stacking direction, and wherein a clamping arrangement is adapted for the power electronic component having a width such that a combined width of the evaporator unit and the power electronic component equals the displacement between the corresponding condenser and a neighbouring condenser.

10. The modular cooling system according to claim 2, wherein the condenser of each cooling module has a coolant medium-intake side and a coolant medium-exit side, and wherein a portion of the first pipe system of each cooling module is disposed to pass along the coolant medium-exit side of the corresponding condenser.

11. The modular cooling system according to claim 2, comprising:
    a condenser-connection arrangement for mechanically connecting the condensers to one another such that the condensers are lined up in the stacking direction and arranged in a common plane.

12. The modular cooling system according to claim 2, wherein the condenser-connection arrangement includes an electrically insulated frame structure configured for attaching the condensers removably thereto.

13. The modular cooling system according to claim 2, wherein a length, in the stacking direction, of the electrically insulated frame structure is adjustable to fit a preselected number of cooling modules.

14. The modular cooling system according to claim 2, wherein a width of the evaporator unit as measured in the stacking direction is less than a width of the corresponding condenser as measured in a direction parallel to the stacking direction, and wherein a clamping arrangement is adapted for the power electronic component having a width such that a combined width of the evaporator unit and the power electronic component equals the displacement between the corresponding condenser and a neighbouring condenser.

15. The modular cooling system according to claim 1, wherein the system is arranged for passing an external coolant medium through the at least one coolant medium passageway of at least one of the condensers, thereby transferring heat from the respective condenser to the external coolant medium in an operating state of the modular cooling system, and thereafter passing the heated external coolant medium along a portion of the first pipe system disposed downstream of a corresponding condenser.

16. The modular cooling system according to claim 4, comprising:
    a condenser-connection arrangement for mechanically connecting the condensers to one another such that the condensers are lined up in the stacking direction and arranged in a common plane.

17. The modular cooling system according to claim 4, wherein the condenser-connection arrangement includes an electrically insulated frame structure configured for attaching the condensers removably thereto.

18. The modular cooling system according to claim 4, wherein a length, in the stacking direction, of the electrically insulated frame structure is adjustable to fit a preselected number of cooling modules.

19. The modular cooling system according to claim 4, wherein a width of the evaporator unit as measured in the stacking direction is less than a width of the corresponding condenser as measured in a direction parallel to the stacking direction, and wherein a clamping arrangement is adapted for the power electronic component having a width such that a combined width of the evaporator unit and the power electronic component equals the displacement between the corresponding condenser and a neighbouring condenser.

20. A power electronic unit comprising:
   the modular cooling system according to claim 1; and
   a plurality of power electronic components,
   wherein a clamping arrangement holds and presses the alternating stack in which the evaporator units are alternately stacked with the power electronic components in the stacking direction.

* * * * *